(12) United States Patent
Takao (10) Patent No.: US 7,579,671 B2
(45) Date of Patent: Aug. 25, 2009

(54) SEMICONDUCTOR DEVICE AND MANUFACTURING METHOD THEREOF

(75) Inventor: Yukihiro Takao, Nitta-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/851,638

(22) Filed: May 24, 2004

(65) Prior Publication Data
US 2005/0006783 A1 Jan. 13, 2005

(30) Foreign Application Priority Data
May 26, 2003 (JP) ............................. 2003-147146

(51) Int. Cl.
*H01L 29/40* (2006.01)
(52) U.S. Cl. ........................ 257/621; 257/711; 257/772; 257/E21.597
(58) Field of Classification Search ................. 257/711, 257/621, 772, E21.597
See application file for complete search history.

(56) References Cited

U.S. PATENT DOCUMENTS

| | | | | |
|---|---|---|---|---|
| 3,761,782 | A * | 9/1973 | Youmans | 257/778 |
| 5,229,647 | A * | 7/1993 | Gnadinger | 257/785 |
| 5,684,331 | A * | 11/1997 | Jun | 257/758 |
| 5,828,010 | A * | 10/1998 | Renz et al. | 174/261 |
| 5,946,555 | A * | 8/1999 | Crumly et al. | 438/125 |
| 5,946,600 | A * | 8/1999 | Hurwitz et al. | 438/688 |
| 5,955,780 | A * | 9/1999 | Suzuki et al. | 257/690 |
| 6,114,221 | A * | 9/2000 | Tonti et al. | 438/455 |
| 6,124,179 | A * | 9/2000 | Adamic, Jr. | 438/309 |
| 6,271,059 | B1 | 8/2001 | Bertin et al. | |
| 6,300,782 | B1 * | 10/2001 | Hembree et al. | 324/760 |
| 6,303,988 | B1 * | 10/2001 | Crumly | 257/690 |
| 6,355,981 | B1 | 3/2002 | Richards et al. | |
| 6,433,427 | B1 * | 8/2002 | Wu et al. | 257/737 |
| 6,492,200 | B1 * | 12/2002 | Park et al. | 438/113 |
| 6,586,829 | B1 * | 7/2003 | Yaniv et al. | 257/693 |
| 6,699,787 | B2 | 3/2004 | Mashino et al. | |
| 6,703,310 | B2 | 3/2004 | Mashino et al. | |
| 6,703,689 | B2 * | 3/2004 | Wada | 257/621 |
| 6,908,784 | B1 * | 6/2005 | Farnworth et al. | 438/106 |

(Continued)

FOREIGN PATENT DOCUMENTS

| | | |
|---|---|---|
| JP | 03-21859 | 3/1991 |
| JP | 2002-512436 | 2/1999 |
| JP | 2002-373895 | 12/2002 |
| JP | 2002-373957 | 12/2002 |
| JP | 2003-116066 | 4/2003 |

OTHER PUBLICATIONS

European Search Report dated Feb. 15, 2007, directed at counterpart EP application No. 04012464.

*Primary Examiner*—Wael Fahmy
*Assistant Examiner*—John C Ingham
(74) *Attorney, Agent, or Firm*—Morrison & Foerster LLP (57) ABSTRACT

Disconnection and deterioration in step coverage of wirings are prevented to offer a semiconductor device having higher reliability. A pad electrode is formed on a surface of a silicon die. A via hole penetrating the silicon die is formed from a back surface of the silicon die to the pad electrode. A wiring layer disposed on the back surface of the silicon die runs through the via hole and is electrically connected with the pad electrode. The wiring layer covers a convex portion of silicon on the back surface of the silicon die. A solder ball is formed on the wiring layer on the convex portion of silicon.

6 Claims, 12 Drawing Sheets

U.S. PATENT DOCUMENTS

| | | | |
|---|---|---|---|
| 2002/0030245 A1* | 3/2002 | Hanaoka et al. | 257/621 |
| 2002/0047210 A1* | 4/2002 | Yamada et al. | 257/774 |
| 2002/0076911 A1 | 6/2002 | Lin | |
| 2003/0080434 A1 | 5/2003 | Wataya | |

* cited by examiner

SEMICONDUCTOR DEVICE AND MANUFACTURING METHOD THEREOF

CROSS-REFERENCE OF THE INVENTION

Japanese Patent Application No. 2003-147146 upon which this application is based is hereby incorporated by reference.

BACKGROUND OF THE INVENTION

1. Field of the Invention

This invention relates to a BGA (Ball Grid Array) type semiconductor device which has a plurality of ball-shaped conductive terminals and its manufacturing method.

2. Description of the Related Art

A CSP (Chip Size Package) receives attention in recent years as a three-dimensional mounting technology as well as a new packaging technology. The CSP means a small package having about the same outside dimensions as those of a semiconductor die packaged in it.

A BGA type semiconductor device has been known as a kind of CSP. A plurality of ball-shaped conductive terminals made of metal such as solder are arrayed in a grid pattern on one surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by compression bonding of the conductive terminals to wiring patterns on the printed circuit board.

Such a BGA type semiconductor device has advantages in providing a large number of conductive terminals and in reducing size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into a mobile telephone, for example.

Figure 20A:
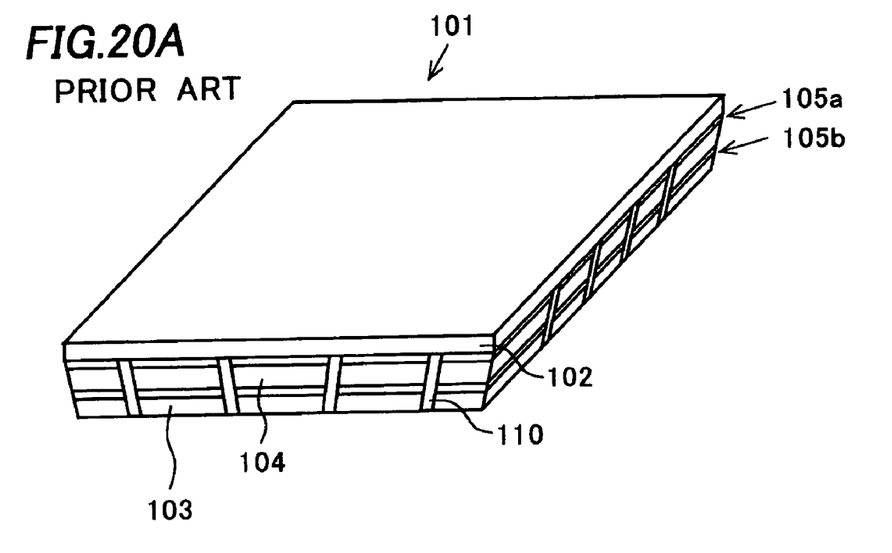
FIGS. 20A and 20B are oblique perspective figures showing a semiconductor device according to a conventional art.
Figure 20B:
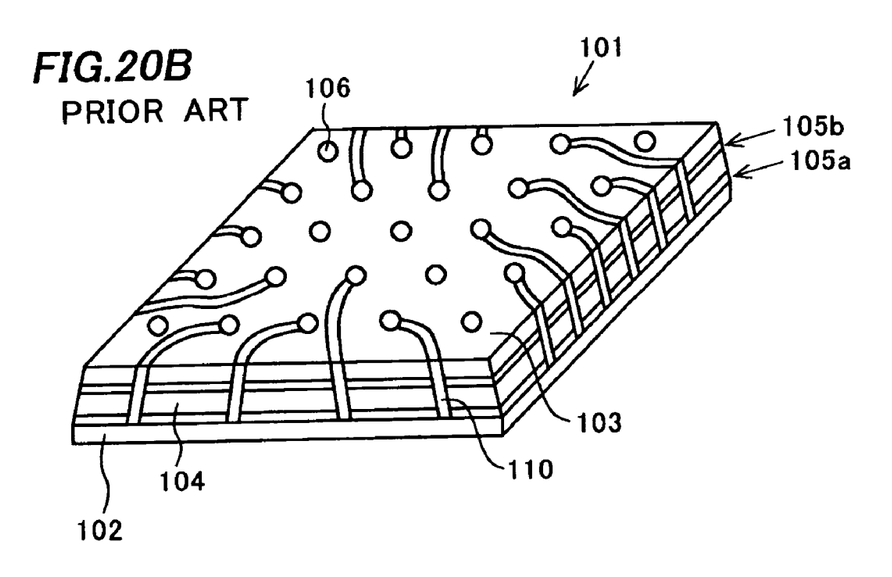

FIGS. 20A and 20B show outline structure of a conventional BGA type semiconductor device. FIG. 20A is an oblique perspective figure of a top side of the BGA type semiconductor device. And FIG. 20B is an oblique perspective figure of a back side of the BGA type semiconductor device.

A semiconductor die 104 is sealed between a first glass substrate 102 and a second glass substrate 103 through epoxy resin layers 105a and 105b in the BGA type semiconductor device 101. A plurality of ball-shaped conductive terminals 106 are arrayed in a grid pattern on a surface of the second glass substrate 103, that is, on a back surface of the BGA type semiconductor device 101. The conductive terminals 106 are connected to the semiconductor die 104 through a plurality of second wirings 110. The plurality of second wirings 110 are connected with aluminum wirings pulled out from inside of the semiconductor die 104, making the ball-shaped terminals 106 electrically connected with the semiconductor die 104.

Figure 21:
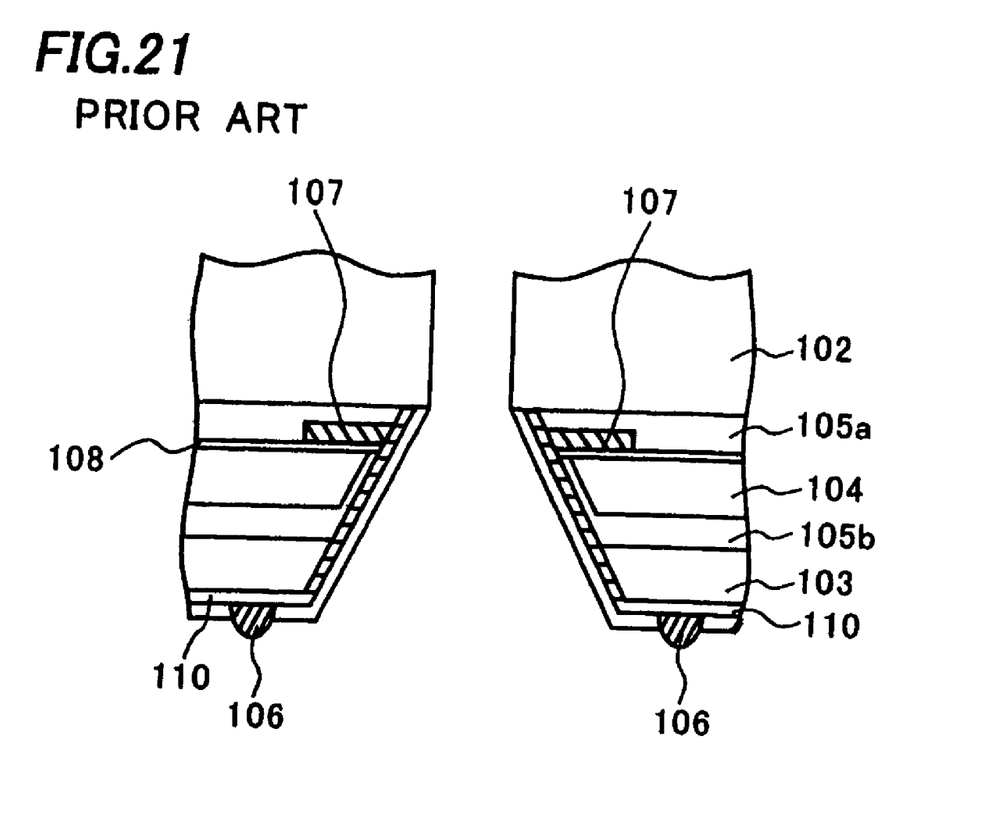
FIG. 21 is a cross-sectional view showing the semiconductor device according to the conventional art.

More detailed explanation on a cross-sectional structure of the BGA type semiconductor device 101 is given hereafter referring to FIG. 21. FIG. 21 shows a cross-sectional view of the BGA type semiconductor devices 101 divided along dicing lines into individual dice.

A first wiring 107 is provided on an insulation film 108 on a top surface of the semiconductor die 104. The semiconductor die 104 is bonded to the first glass substrate 102 with the resin layer 105a. A back surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. And the ball-shaped conductive terminal 106 is formed on the second wiring 110 extended onto the second glass substrate 103.

However, there is a possibility that the first wiring 107 and the second wiring 110 are disconnected at a point of contact between them, since the area of the point of contact is very small in the BGA type semiconductor device 101 described above. Also there is a problem in step coverage of the second wiring 110.

SUMMARY OF THE INVENTION

This invention is directed to solve the problems addressed above and offers a semiconductor device having a pad electrode provided on a first surface of a semiconductor die, a convex portion of semiconductor on a second surface of the semiconductor die and a supporting substrate bonded to the first surface of the semiconductor die provided with the pad electrode. And a via hole is formed in the semiconductor die from the second surface of the semiconductor die to a surface of the pad electrode and a wiring layer electrically connected with the pad electrode through the via hole is formed to extend from the via hole onto the second surface of the semiconductor die and to cover the convex portion of the semiconductor. In addition, a conductive terminal electrically connected with the wiring layer is formed on a portion of the wiring layer covering the convex portion of semiconductor.

Disconnection and deterioration in step coverage of the wiring everywhere between the pad electrode on the semiconductor die and the conductive terminal can be prevented with this invention, leading to a BGA type semiconductor device of higher reliability. Since the conductive terminal is formed on the convex portion of the semiconductor, the conductive terminal is formed at a location elevated by a height of the convex portion above the second surface of the semiconductor die. That makes it easier to relax thermal stress caused in mounting the semiconductor device on the printed circuit board, preventing damage to the conductive terminal.

DETAILED DESCRIPTION OF THE INVENTION

Next, a first embodiment of this invention will be described in detail, referring to figures hereinafter.

Figure 14:
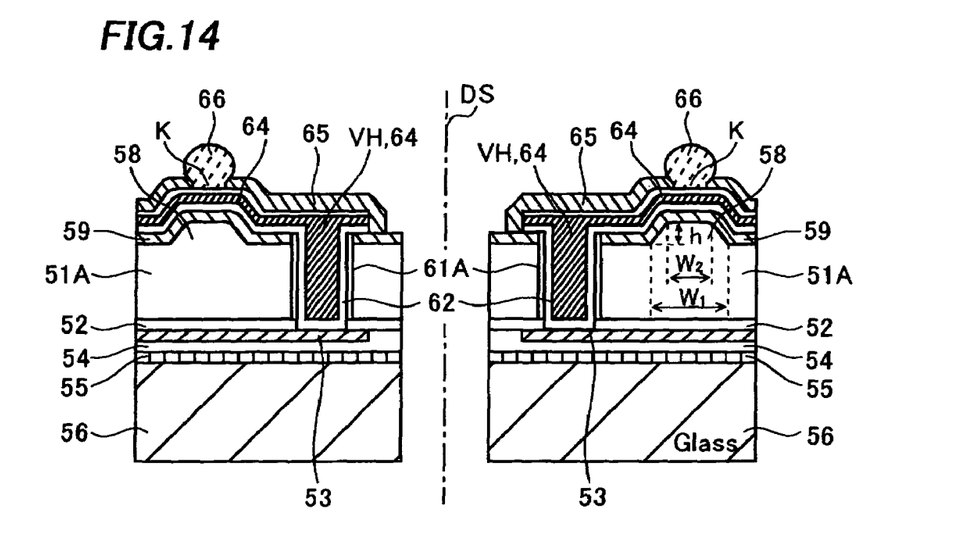
FIG. 14 is a cross-sectional view showing the semiconductor device and its manufacturing method according to the first embodiment of this invention.

First, a structure of the semiconductor device will be described. FIG. 14 is a cross-sectional view of the semiconductor device separated into individual dice by dicing a silicon wafer along a dicing line after process steps to be described later. DS in FIG. 14 denotes a center of the dicing line.

A pad electrode 53 is formed on a surface which is a first surface of a silicon die 51A through an interlayer insulation film 52. The silicon die 51A is a CCD (Charge Couples Device) image sensor chip, for example. The pad electrode 53 is formed by extending a normal pad electrode used for wire bonding to the dicing line region and is also called an extended pad electrode.

The pad electrode 53 is covered with a passivation film 54 made of a silicon nitride film, for example. A glass substrate 56 is bonded through a resin layer 55 made of an epoxy resin, for example, to a surface of the silicon die 51A, on which the pad electrode 53 is formed. The glass substrate 56 is used as a supporting substrate to bolster the silicon die 51A. When the silicon die 51A is the CCD image sensor chip, using a transparent substrate such as the glass substrate 56 or a semitransparent substrate is required because light from outside needs to be received by the CCDs on the surface of the silicon die 51A. An opaque substrate may be used when the silicon die 51A is not a light-receiving or a light-emitting chip.

A via hole VH is formed in the silicon die 51A from a second surface which is a back surface of the silicon die 51A and to reach the pad electrode 53. A sidewall insulation film 61A is formed on a sidewall of the via hole VH. The sidewall insulation film 61A isolates the silicon die 51A from a wiring layer 64 which will be described below.

A convex portion 58 of silicon is formed on the back surface of the silicon die 51A in a region adjacent the via hole VH. The convex portion 58 of silicon is formed by etching a silicon substrate selectively, and height h of the convex portion is about 35 μm from the back surface of the silicon die 51A. The higher the height h is, the more effective to relax thermal stress when mounting the semiconductor device on a printed circuit board. A width W1 of the convex portion 58 at its bottom is about 400 μm, and is determined according to a diameter of a solder ball. A width W2 of the convex portion 58 at its top is about 340 μm. A thickness of the silicon die 51A is about 135 μm.

The back surface of the silicon die 51A and the convex portion 58 of silicon are covered with a first insulation film 59. The first insulation film 59 isolates the silicon die 51A from the wiring layer 64.

The wiring layer 64 connected to the pad electrode 53 electrically through the via hole VH is formed to extend from the via hole VH onto the back surface of the silicon die 51A. The wiring layer 64 is also called a re-distribution layer, and has a structure of a layer of barrier metal such as Ni/Au stacked on a layer of copper (Cu), for example. A seed layer 62 is provided under the wiring layer 64. The seed layer 62 is a metal layer serving as a plating electrode in forming the wiring layer 64 by electrolytic plating.

When a metal having a high diffusivity into silicon such as copper is used for wiring, forming a barrier layer (TiN layer or TiW layer, for example) under the seed layer 62 is preferred in order to prevent device characteristics from deteriorating by diffusion of copper. The wiring layer 64 extends over the back surface of the silicon die 51A to cover the convex portion 58 of silicon.

And the wiring layer 64 is covered with a solder mask 65 which makes a protection film. An opening K is formed in the solder mask 65 above the convex portion 58 of silicon. A solder ball 66 which makes the conductive terminal is mounted through the opening K in the solder mask 65. The solder ball 66 is hereby electrically connected with the wiring layer 64. A BGA structure is obtained by forming a plurality of such solder balls 66.

Wiring between the pad electrodes 53 on the silicon die 51A and the solder balls 66 formed on its back surface is formed as described above. Since the wiring is made through the via hole VH, disconnection occurs hardly and step coverage is excellent. In addition, mechanical strength of the wiring is high. Furthermore, since the solder ball 66 is disposed on the convex portion 58 of silicon, the location of the solder ball is higher by the height of the convex portion than the back surface of the silicon die 51A. Because of that, the solder ball 66 and the silicon die 51A are better protected from potential damage caused by stress due to difference in coefficients of thermal expansion between the printed circuit board and the solder ball 66, when the semiconductor device is mounted on the printed circuit board.

Figure 1:
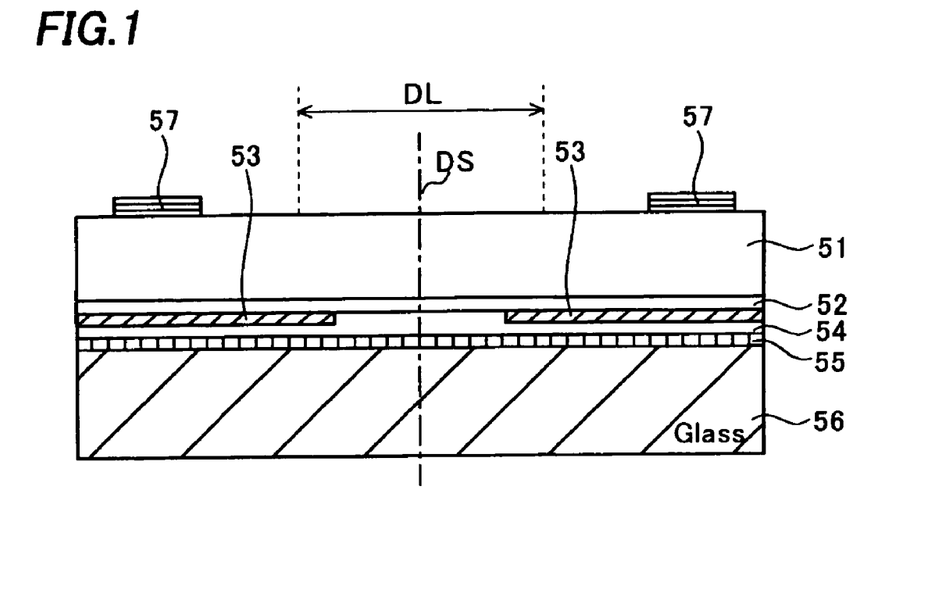
FIG. 1 is a cross-sectional view showing a manufacturing method of a semiconductor device according to a first embodiment of this invention.

Next, a manufacturing method of the semiconductor device will be described hereinafter. It is assumed that a semiconductor integrated circuit (a CCD image sensor, for example, not shown) is formed on a surface of a silicon wafer 51. FIG. 1 shows a cross-section of neighboring dice around a border along which the dice are to be separated in a subsequent dicing process.

A pair of pad electrodes 53 is formed on a surface of the silicon wafer 51 through the interlayer insulation film 52 such as BPSG (Boro-Phospho Silicate Glass). The pair of pad electrodes 53 is formed of a layer of metal such as aluminum, aluminum alloy or copper, and is about 1 μm thick. The pair of pad electrodes 53 extends into a dicing line region DL with their extended ends being close to the center line DS of the dicing line.

The passivation film 54 made of a silicon nitride film, for example, is formed to cover the pair of pad electrodes 53 and a resin layer 55 made of an epoxy resin, for example, is applied to the passivation film 54. Then the glass substrate 56 is bonded to the surface of the silicon wafer 51 through the resin layer 55. The glass substrate 56 works as a substrate to protect and bolster the silicon wafer 51. After the glass substrate 56 is bonded, thickness of the silicon wafer 51 is reduced to about 170 μm by back surface etching or so-called back-grinding when needed.

A photoresist is applied to the entire back surface of the silicon wafer 51 after the back-grinding. A photoresist layer 57 is formed selectively by exposure and development of the photoresist.

Figure 2:
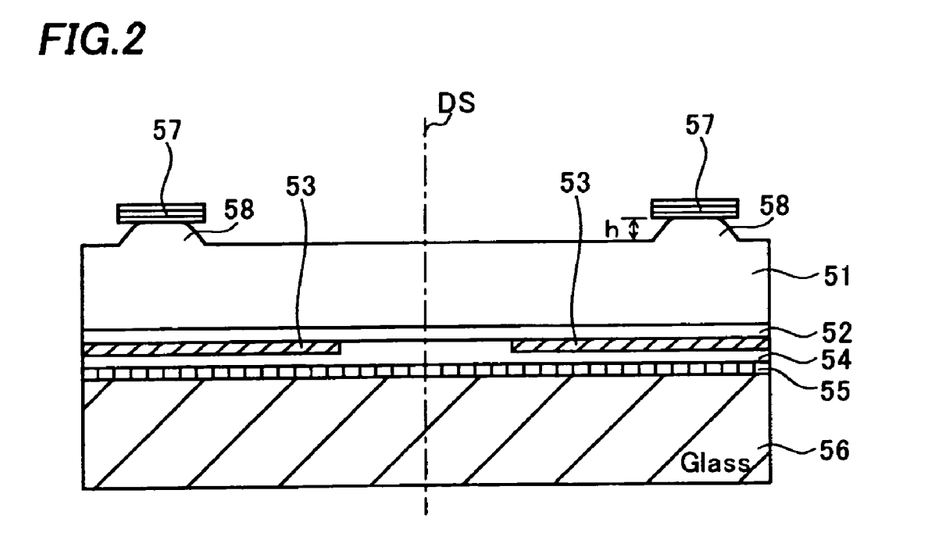
FIG. 2 is a cross-sectional view showing the manufacturing method of the semiconductor device according to the first embodiment of this invention.

The convex portions 58 of silicon are formed by etching the back surface of the silicon wafer 51 using the photoresist layer 57 as a mask, as shown in FIG. 2. The etching can be either wet etching using a spin etcher or dry etching. The height h of the convex portion 58 of silicon is about 35 μm and can be varied arbitrarily by adjusting an amount of the etching.

Figure 3:
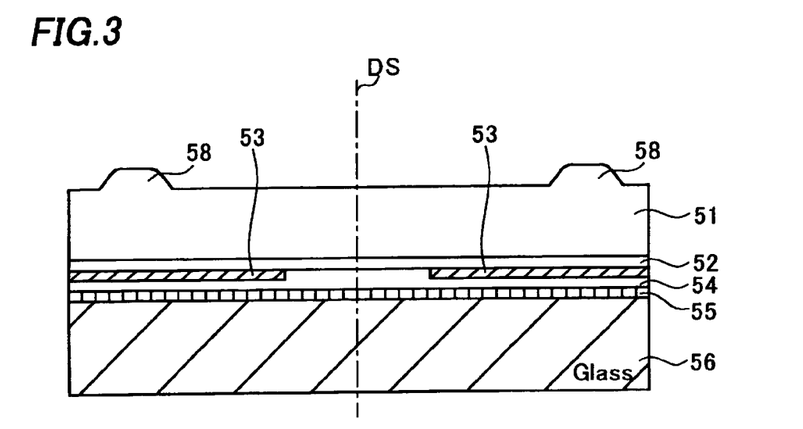
FIG. 3 is a cross-sectional view showing the manufacturing method of the semiconductor device according to the first embodiment of this invention.

After removing the photoresist layer 57 using a photoresist stripping solution, the back surface of the silicon wafer 51 is wet-etched by about 5 μm using the spin etcher or the like, as shown in FIG. 3. Corners at top edges of the convex portions 58 of silicon are rounded with this, resulting in improvement of step coverage of the first insulation film 59.

Figure 4:
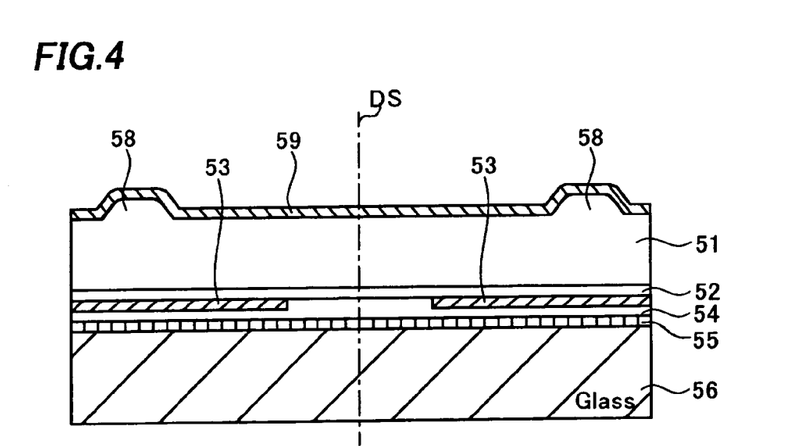
FIG. 4 is a cross-sectional view showing the manufacturing method of the semiconductor device according to the first embodiment of this invention.

Next, the first insulation film 59 is formed on the entire back surface of the silicon wafer 51, as shown in FIG. 4. The first insulation film 59 is made by plasma CVD (Chemical Vapor Deposition), for example, and a PE-SiO2 film and a PE-SiN film are suitable for it.

Figure 5:
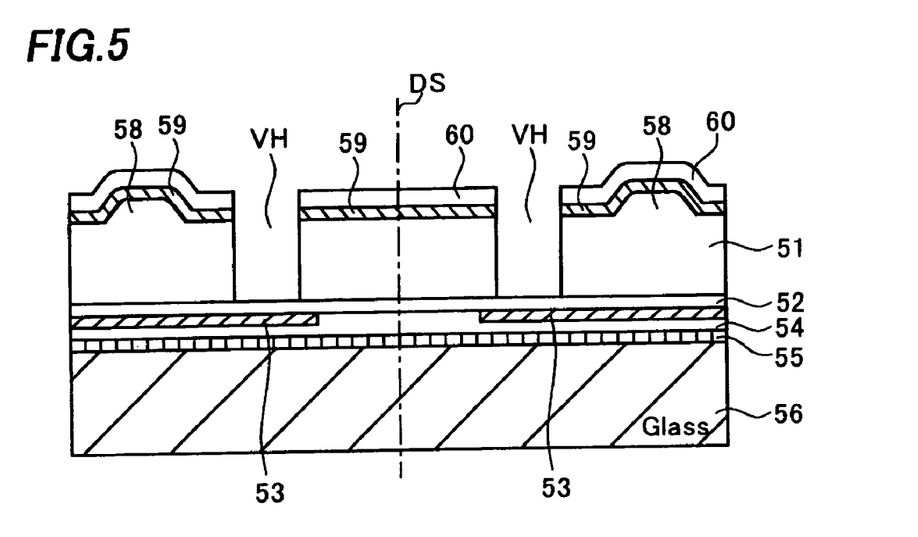
FIG. 5 is a cross-sectional view showing the manufacturing method of the semiconductor device according to the first embodiment of this invention.

Next, a photoresist layer 60 is formed selectively on the first insulation film 59 and the via holes VH penetrating the silicon wafer 51 are formed by etching the first insulation film 59 and the silicon wafer 51 using the photoresist layer 60 as a mask, as shown in FIG. 5. The interlayer insulation film 52 is exposed at the bottom of each of the via holes VH. The pad electrode 53 is adjacent the interlayer insulation film 52. Width of the via hole is about 40 μm and its length is about 200 μm.

The via holes VH may be formed by etching using a laser beam or by dry etching. The via holes VH are preferably formed to have tapered cross-sectional shape by controlling the laser beam in order to improve coverage of the seed layer 62.

Figure 6:
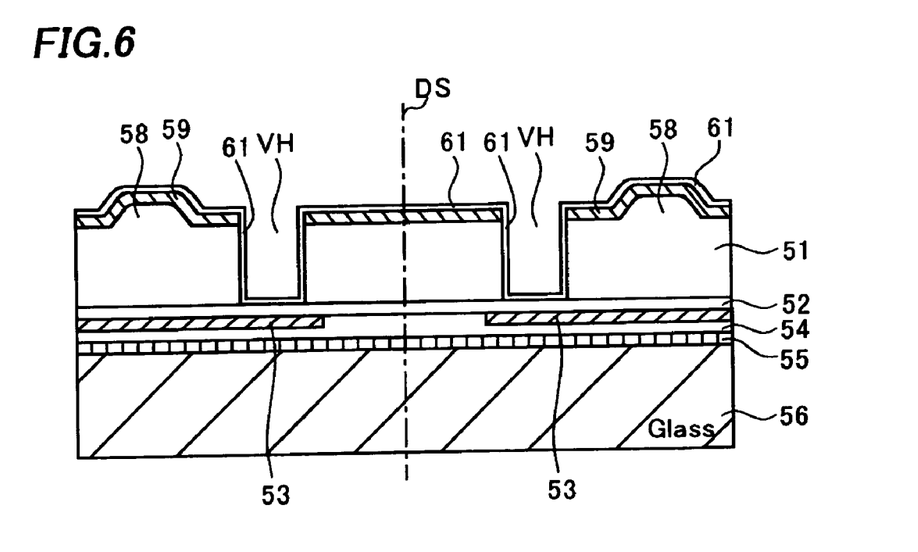
FIG. 6 is a cross-sectional view showing the manufacturing method of the semiconductor device according to the first embodiment of this invention.

Next, a second insulation film 61 is formed on the entire back surface of the silicon wafer 51 in which the via holes VH are formed, as shown in FIG. 6. The second insulation film 61 is made by plasma CVD, for example, and a PE-SiO2 film and a PE-SiN film are suitable for it. The second insulation film 61 is formed on the bottom and the sidewall of the via holes VH and on the first insulation film 59.

Figure 7:
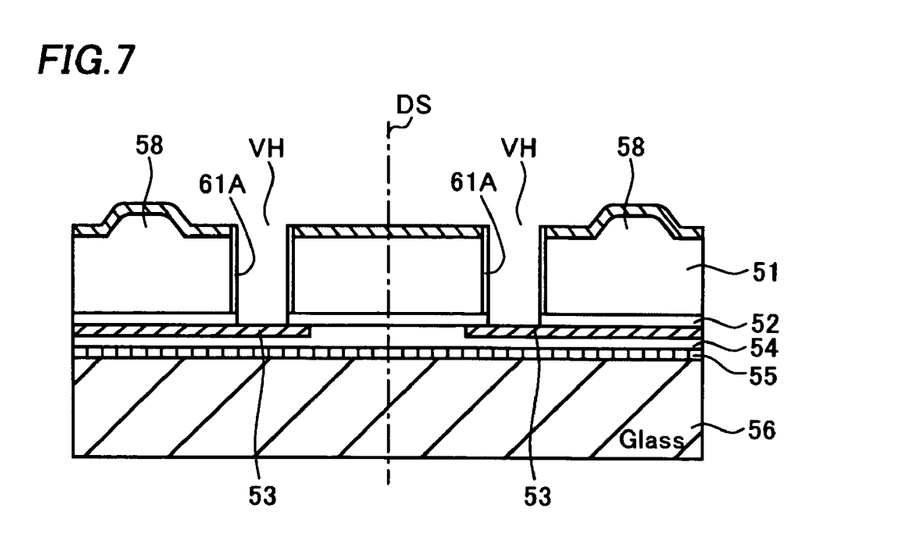
FIG. 7 is a cross-sectional view showing the manufacturing method of the semiconductor device according to the first embodiment of this invention.

Anisotropic dry etching without using a mask of a photoresist layer leaves the second insulation film 61 only on the sidewalls of the via holes VH, which makes the sidewall insulation films 61A, as shown in FIG. 7. The second insulation film 61 and the interlayer insulation film 52 at the bottom of the via holes VH are etched off in this etching process to expose the pad electrodes 53.

As an alternative method to expose the pad electrodes 53, the second insulation film 61 may be formed after removing the interlayer insulation film 52 by anisotropic etching and then the second insulation film 61 at the bottom of the via holes VH may be removed by another anisotropic etching to expose the pad electrodes 53. Purpose is to secure good step coverage of the sidewall insulation film 61A.

Figure 8:
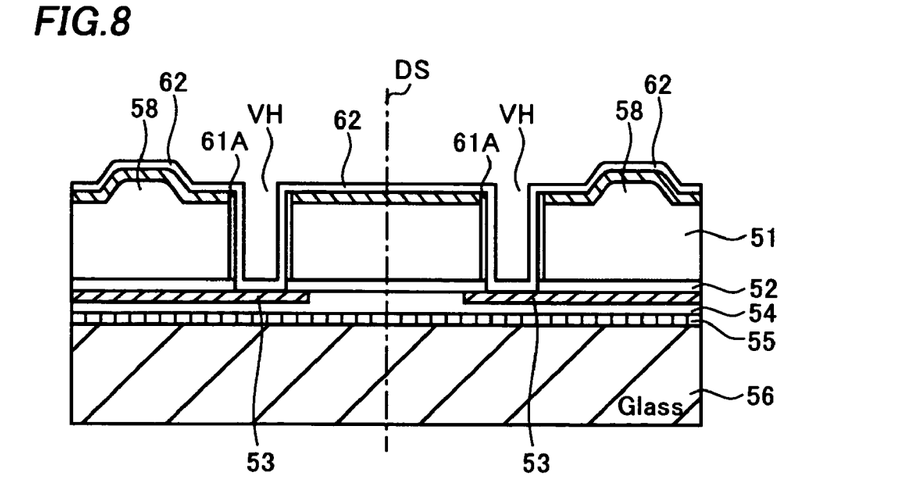
FIG. 8 is a cross-sectional view showing the manufacturing method of the semiconductor device according to the first embodiment of this invention.

Next, a process to form the wiring layer 64 is described. The seed layer 62 made of copper (Cu) is formed on the entire surface by electroless plating or by CVD after forming the barrier layer (TiN layer, for example) by sputtering or by CVD, as shown in FIG. 8. The seed layer 62 serves as a plating electrode for growth of plating film during electrolytic plating. Thickness of about 100 nm is enough for it. The seed layer 62 can be formed by sputtering when the via holes VH are formed in the tapered down shape. The barrier layer is formed to prevent copper from diffusing into silicon as mentioned before and its thickness is several tens of nanometers.

Figure 9:
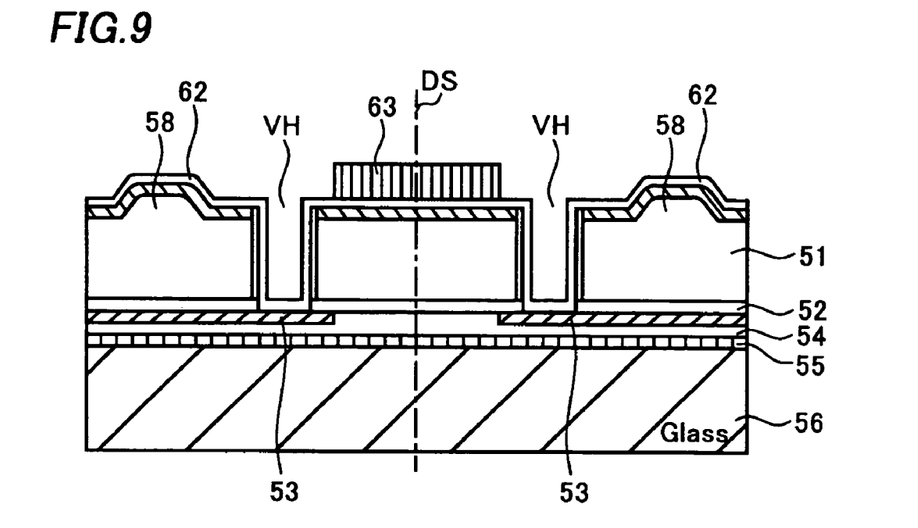
FIG. 9 is a cross-sectional view showing the manufacturing method of the semiconductor device according to the first embodiment of this invention.

A photoresist layer 63 is formed on a region where the plating is not to be made (Refer to FIG. 9.), prior to electrolytic plating of copper (Cu). The region is a region except for regions to form the wiring layer 64 and the solder balls.

Figure 10:
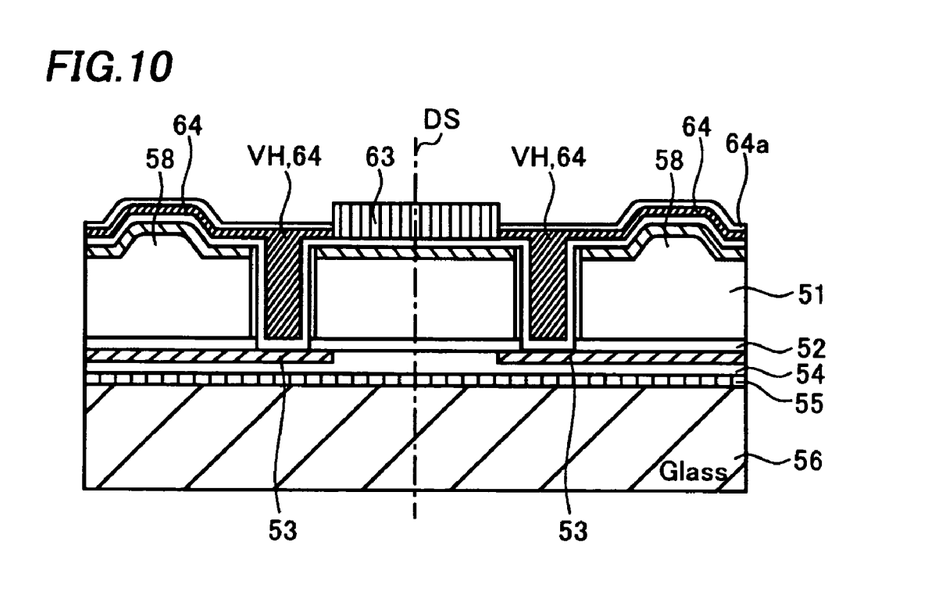
FIG. 10 is a cross-sectional view showing the manufacturing method of the semiconductor device according to the first embodiment of this invention.

Then the wiring layer 64 is formed to fill the via holes VH completely by electrolytic plating of copper (Cu) followed by electroless plating of nickel (Ni) and gold (Au), as shown in FIG. 10. Ni and Au mentioned above make barrier metal 64a and may be formed by sputtering. The wiring layer 64 fills the via holes VH and extends over the back surface of the silicon wafer to cover the convex portions 58 of silicon. The wiring layer 64 is electrically connected with the pad electrodes 53 through the seed layer 62.

Although this method is good to reduce the process steps, it has a demerit of not being able to optimize both the thickness of plated wiring layer 64 and the thickness of the plated layer in the via holes VH, since the two thicknesses can not be controlled independently. Thus while the wiring layer 64 in the via holes VH (also referred to as a pillar-shaped conductive path) is formed by electrolytic plating, rest of the wiring layer 64 may be formed by Al sputtering or by another electrolytic plating.

Figure 11:
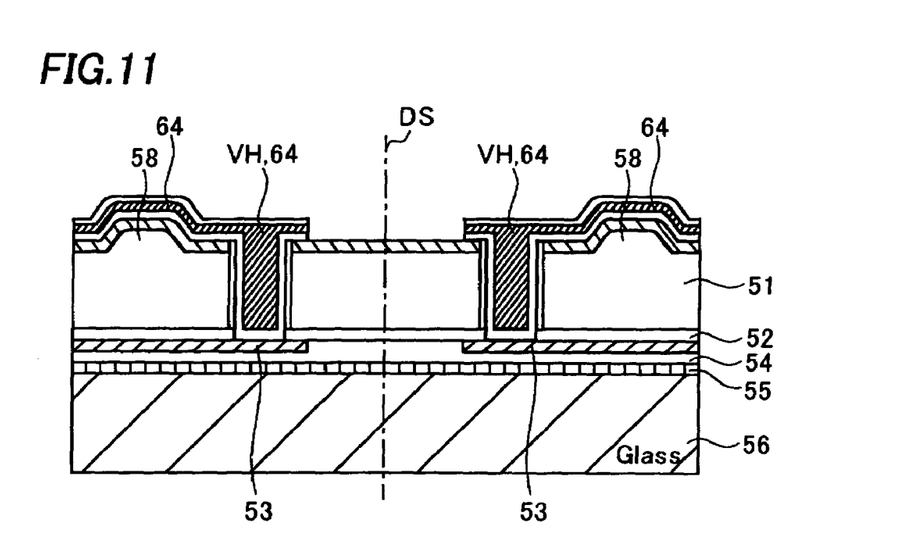
FIG. 11 is a cross-sectional view showing the manufacturing method of the semiconductor device according to the first embodiment of this invention.

Then the photoresist layer 63 is removed, as shown in FIG. 11. The seed layer 62 is removed from a region under the photoresist layer 63 by etching using the wiring layer 64 as a mask. Although the wiring layer 64 is also etched in the process, it causes no problem since the wiring layer 64 is thicker than the seed layer 62.

Figure 12:
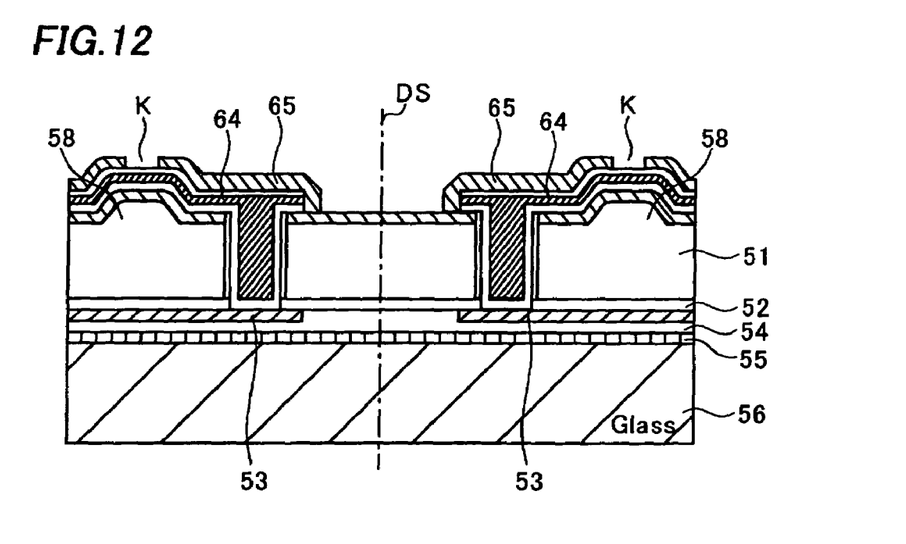
FIG. 12 is a cross-sectional view showing the manufacturing method of the semiconductor device according to the first embodiment of this invention.

Next, the wiring layer 64 is covered with the solder mask 65, as shown in FIG. 12. The solder mask 65 is removed from regions above the convex portions 58 of silicon to provide the openings K.

Figure 13:
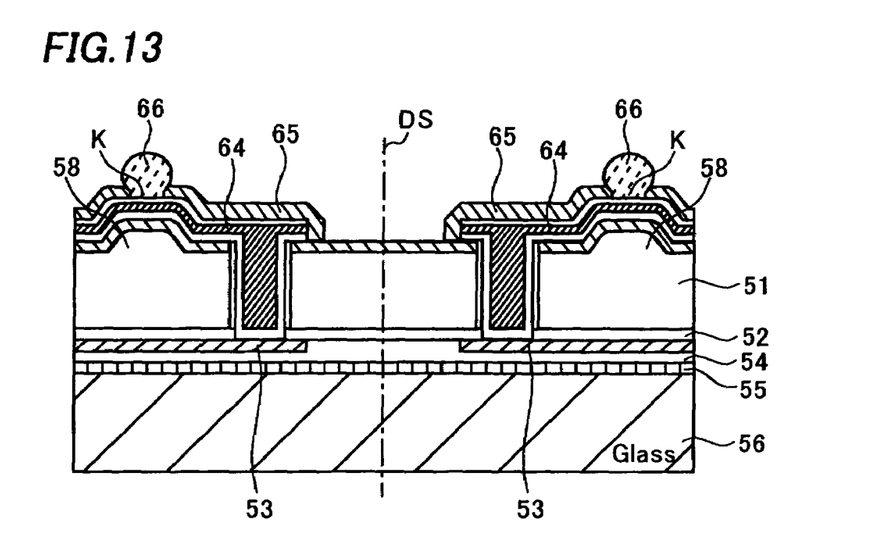
FIG. 13 is a cross-sectional view showing the manufacturing method of the semiconductor device according to the first embodiment of this invention.

And solder is printed on predetermined regions on the wiring layer 64 using screen printing, and the solder is reflowed by heat treatment to form the solder balls 66, as shown in FIG. 13. Note that desired number of the wiring layers 64 can be formed in desired regions on the back surface of the silicon wafer 51 and that number and locations of the solder balls 66 can be chosen at will.

The silicon wafer 51 is separated into the plurality of silicon dice 51A by dicing along the dicing line center DS, as shown in FIG. 14. The laser beam may be used in the dicing process. When the laser beam is used in the dicing process, cut surface of the glass substrate 56 may be made tapered so that cracking of the glass substrate 56 is prevented.

Figure 19:
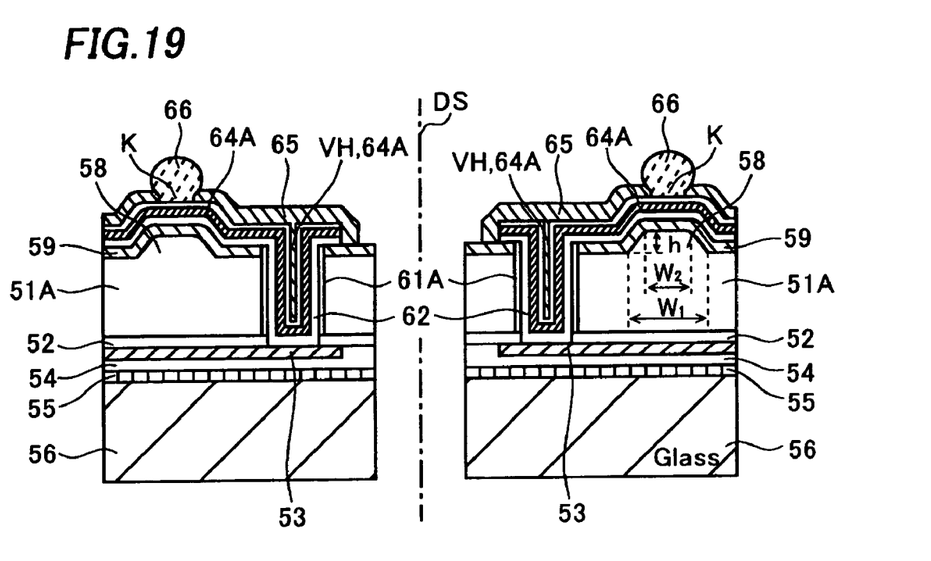
FIG. 19 is a cross-sectional view showing the semiconductor device and its manufacturing method according to the second embodiment of this invention.

Next, a second embodiment of this invention will be described in detail, referring to figures hereinafter. First, a structure of the semiconductor device will be described. FIG. 19 is a cross-sectional view of the semiconductor device separated into individual dice by dicing a silicon wafer along a dicing line after process steps to be described later. DS in FIG. 19 denotes a center of the dicing line. The same symbols are used in FIG. 19 to denote the same components as in the first embodiment shown in FIG. 14, and detailed explanations on them are omitted.

The second embodiment is different from the first embodiment in that the wiring layer 64A fills the via hole VH incompletely, while the wiring layer 64A fills the via hole VH completely according to the first embodiment. In other words, although the wiring layer 64 covers the bottom and the sidewall of the via hole VH, there is a hollow space in the via hole VH because its thickness is smaller than the radius of the via hole VH. A part of the solder mask 65 fills this space. The semiconductor device according to this structure has higher resistance against mechanical stress caused in mounting it to a printed circuit board than the semiconductor device according to the first embodiment in which the wiring layer 64 fills the via hole VH completely.

A manufacturing method of the semiconductor device according to the second embodiment will be described next. The manufacturing method is the same as that in the first embodiment in process steps from the first process step through the process step to form the photoresist layer 63 (process steps shown in FIGS. 1-9).

Figure 15:
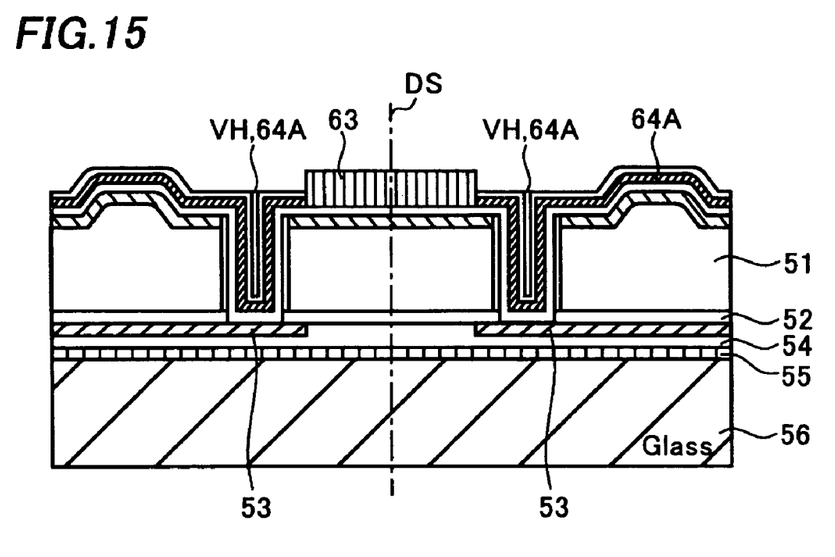
FIG. 15 is a cross-sectional view showing a manufacturing method of a semiconductor device according to a second embodiment of this invention.

Then, the wiring layer 64A is formed to fill the via hole VH incompletely by electrolytic plating of copper (Cu) followed by electroless plating of nickel (Ni) and gold (Au), after forming the photoresist layer 63, as shown in FIG. 15. In this process step, filling the via hole VH incompletely with the wiring layer 64 is made possible by adjusting length of time to give plating.

Figure 16:
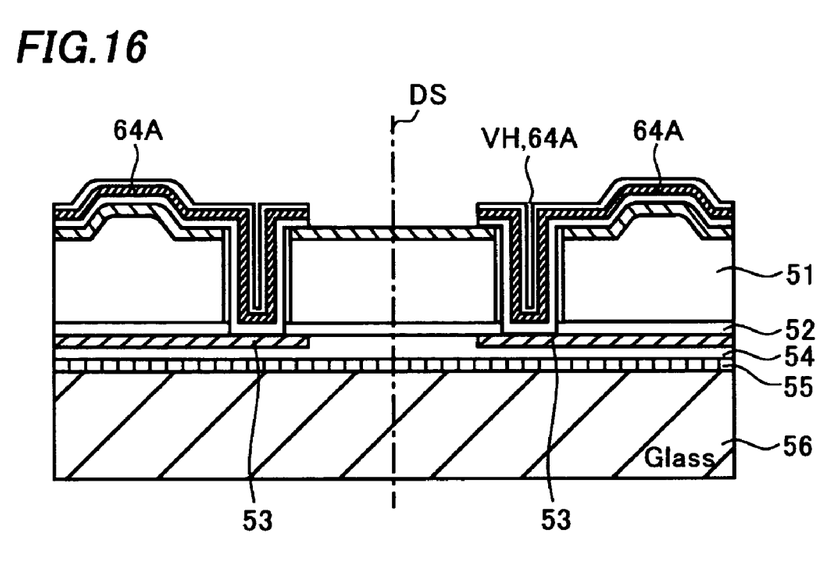
FIG. 16 is a cross-sectional view showing the manufacturing method of the semiconductor device according to the second embodiment of this invention.
Figure 17:
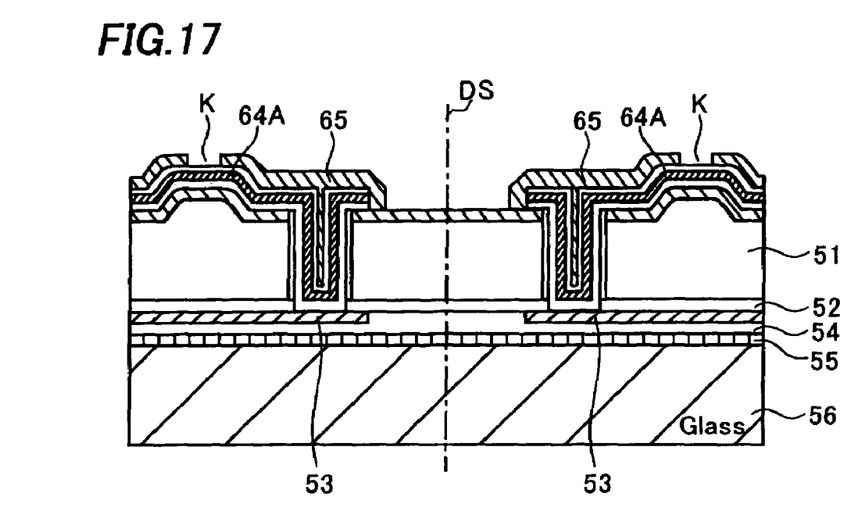
FIG. 17 is a cross-sectional view showing the manufacturing method of the semiconductor device according to the second embodiment of this invention.

The rest of the process is the same as in the first embodiment. After the photoresist layer 63 is removed, the seed layer 62 is removed from the region under the photoresist layer 63 by etching using the wiring layer 64 as a mask, as shown in FIG. 16. Then the wiring layer 64A is covered with the solder mask 65, as shown in FIG. 17.

Figure 18:
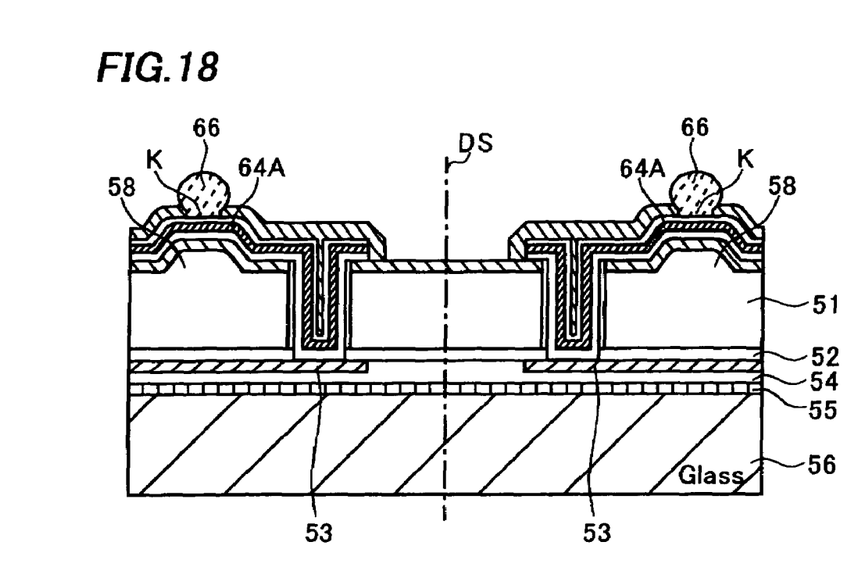
FIG. 18 is a cross-sectional view showing the manufacturing method of the semiconductor device according to the second embodiment of this invention.

And solder is printed on predetermined regions on the wiring layers 64A using screen printing, and the solder is reflowed by heat treatment to form the solder balls 66, as shown in FIG. 18.

The silicon wafer 51 is separated into the plurality of silicon dice 51A by dicing along the dicing line center DS, as shown in FIG. 19.

This invention is not limited to the first and the second embodiments in which the wiring layer 64 and 64A are formed to fill the via hole VH by electrolytic plating. Other methods may be used. A method filling the via hole VH with metal such as copper (Cu) by CVD or MOCVD (Metal Organic Chemical Vapor Deposition) may be used, for example.

Also, this invention is not limited to the above-mentioned embodiments in which the solder ball 66 is formed on the wiring layer 64 or 64A extending from the via hole VH. The solder ball 66 may be formed on the wiring layer 64 or 64A buried in the via hole VH.

Furthermore, this invention is not limited to including the pad electrode 53 formed by extending a normal pad electrode used for wire bonding to the dicing line region DL as described in the embodiments. The normal pad electrode used for wire bonding not extended to the dicing line region DL may be used instead of the pad electrode 53. In this case, only a location to form the via hole VH is required to be adjusted to a location of the normal pad, leaving other manufacturing process steps unchanged.

Disconnection and deterioration in step coverage of the wiring between the pad electrode on the semiconductor die and the conductive terminal on the back surface of the semiconductor die can be prevented with this invention, leading to a BGA type semiconductor device having higher reliability.

Since the conductive terminal is formed on the convex portion of the semiconductor, the conductive terminal is formed at the location elevated above the back surface of the semiconductor die. That makes it easier to absorb stress caused in mounting the semiconductor device on the printed circuit board, enabling preventing damage to the conductive terminal.

What is claimed is:

1. A semiconductor device comprising:
   a semiconductor die comprising a first surface and a second surface, a via hole being formed in the semiconductor die between the first and second surfaces;
   a pad electrode disposed on the first surface of the semiconductor die and covering one end of the via hole;
   a first insulation layer formed on the second surface of the semiconductor die;
   a wiring layer formed on the first insulation layer and electrically connected with the pad electrode through the via hole, the wiring layer at least partially filling the via hole;
   a protection layer covering the wiring layer; and
   a conductive terminal formed on a portion of the wiring layer away from the via hole and electrically connected with the wiring layer through a hole formed in the protection layer,
   wherein the wiring layer does not extend to a lateral edge of the semiconductor die so as to expose the first insulation layer at the lateral edge,
   the protection layer does not extend to the lateral edge of the semiconductor die so as to expose the first insulation layer on the second surface of the semiconductor die, and
   the first insulation layer electrically insulates the wiring layer from the second surface of the semiconductor die.

2. The semiconductor device of claim 1, further comprising a second insulation layer formed on a sidewall of the via hole to electrically isolate the wiring layer from the semiconductor die.

3. The semiconductor device of claim 1, wherein the via hole is completely filled with the wiring layer.

4. The semiconductor device of claim 1, wherein the via hole is not completely filled with the wiring layer.

5. The semiconductor device of claim 1, further comprising a supporting substrate disposed on the first surface of the semiconductor die.

6. A semiconductor device comprising:
   a semiconductor die comprising a first surface and a second surface, a via hole being formed in the semiconductor die between the first and second surfaces;
   a pad electrode disposed on the first surface of the semiconductor die and covering one end of the via hole;
   a first insulation layer formed on the second surface of the semiconductor die;

a wiring layer formed on the first insulation layer and electrically connected with the pad electrode through the via hole, the wiring layer partially filling the via hole so as to leave an elongated hollow space in the via hole;

a protection layer covering the wiring layer and extending into the elongated hollow space so as to reach a bottom of the elongated hollow space; and a conductive terminal formed on a portion of the wiring layer away from the via hole and electrically connected with the wiring layer through a hole formed in the protection layer, wherein the wiring layer does not extend to a lateral edge of the semiconductor die so as to expose the first insulation layer at the lateral edge, and the first insulation layer electrically insulates the wiring layer from the second surface of the semiconductor die.

* * * * *